(12) United States Patent
Camiolo et al.

(10) Patent No.: US 11,557,897 B2
(45) Date of Patent: Jan. 17, 2023

(54) USB-PD INTERFACE AND ASSOCIATED METHOD

(71) Applicant: STMicroelectronics (Grenoble 2) SAS, Grenoble (FR)

(72) Inventors: Jean Camiolo, St. Egreve (FR); Cedric Force, Saint-Egreve (FR); Christophe Cochard, Pontcharra (FR); Alexandre Pons, Vizille (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 149 days.

(21) Appl. No.: 17/184,027

(22) Filed: Feb. 24, 2021

(65) Prior Publication Data

US 2021/0263579 A1    Aug. 26, 2021

(30) Foreign Application Priority Data

Feb. 25, 2020   (FR) ...................................... 2001838

(51) Int. Cl.
*H02J 1/00*        (2006.01)
*H02J 1/08*        (2006.01)
*G01R 19/165*      (2006.01)

(52) U.S. Cl.
CPC ........ *H02J 1/082* (2020.01); *G01R 19/16566* (2013.01); *G06F 2213/0042* (2013.01)

(58) Field of Classification Search
CPC ... H02J 1/082; H02J 1/001; G06F 2213/0042; G01R 19/16566
See application file for complete search history.

(56) References Cited

U.S. PATENT DOCUMENTS

| | | | |
|---|---|---|---|
| 2014/0183974 A1* | 7/2014 | Proefrock | H02J 1/10 307/130 |
| 2016/0116928 A1* | 4/2016 | Motoki | G05F 1/575 323/280 |
| 2016/0131713 A1* | 5/2016 | Edwards | G01R 19/16566 324/415 |
| 2019/0236040 A1* | 8/2019 | Armstrong | G06F 13/4282 |
| 2020/0373843 A1 | 11/2020 | Camiolo et al. | |

FOREIGN PATENT DOCUMENTS

JP          2016012958 A       1/2016

* cited by examiner

*Primary Examiner* — Harry R Behm
(74) *Attorney, Agent, or Firm* — Slater Matsil, LLP

(57) ABSTRACT

The present disclosure relates to an interface comprising: a terminal for delivering a DC voltage; a comparator for delivering a first signal representative of a comparison of the DC voltage with a high threshold; a comparator for delivering a second signal representative of a comparison of the DC voltage with a low threshold; and a circuit configured to: deliver successive pairs of values of high and low thresholds for a time period after the DC voltage crosses a first value of the low threshold; modify successive pairs of values of the thresholds based on the first and second signals to determine values of thresholds surrounding the DC voltage; and determining a current value of the DC voltage based on the values of thresholds surrounding the DC voltage.

20 Claims, 6 Drawing Sheets

USB-PD INTERFACE AND ASSOCIATED METHOD

CROSS-REFERENCE TO RELATED APPLICATIONS

This application claims the benefit of French Application No. 2001838, filed on Feb. 25, 2020, which application is hereby incorporated herein by reference.

TECHNICAL FIELD

The present disclosure relates generally to interfaces powering a load from a power source, and associated methods. The application more particularly relates to a power supply interface connected between a power source and a USB-C-type connector, the connector being intended to be electrically coupled to a load to be powered, particularly by a USB-C-type cable, and an associated method.

BACKGROUND

Although, currently, wireless connection is one of the main research axes in the field of power and data exchange, cables still seem to be the most reliable way to connect a plurality of electronic devices, be it to exchange data or to power or charge one or a plurality of electronic devices.

Among the different types of cables and connectors of the USB ("Universal Serial Bus") standard, the USB-C type is one of the types which enables to exchange data and power. The USB-PD technology ("USB Power Delivery") is a technology which is adapted for USB-C-type cables and connectors. Such a technology enables management of the powering of electronic devices.

SUMMARY

It would be desirable to be able to at least partly improve certain aspects of known interfaces powering a load from a power source, in particular power supply interfaces adapted to the USB-PD technology.

An embodiment overcomes all or part of the disadvantages of known interfaces powering a load from a power source, in particular, of known power supply interfaces adapted to the USB-PD technology.

An embodiment provides a power supply interface comprising:
a first terminal configured to deliver a first DC voltage;
a comparator configured to deliver a first signal representative of a comparison of the first voltage with a high threshold;
a comparator configured to deliver a second signal representative of a comparison of the first voltage with a low threshold; and
a first circuit configured to:
  deliver successive pairs of values of the high and low thresholds for a first time period after the first voltage becomes smaller than a first value of the low threshold;
  modify successive pairs of values of the high and low thresholds between two successive pairs based on the first and second signals to determine a pair of values of the high and low thresholds surrounding the first voltage; and
  determining a current value of the first voltage based on the pair of values of the high and low thresholds surrounding the first voltage.

According to an embodiment, the interface further comprises:
a voltage converter comprising a second terminal configured to deliver a second DC voltage;
a resistor and a switch in series between the second terminal and the first terminal; and
a second circuit configured to deliver a control signal to the converter so that the first voltage is equal to a first set point value.

According to an embodiment, the first circuit is configured to determine a current value of the first set point value based on the current value of the first voltage.

According to an embodiment, the second circuit is configured to determine the control signal so that, when switch is conductive:
the first set point value is equal to a second set point value when a current in the resistor is smaller than a current threshold; and
the first set point value is smaller than the second set point value when the current is greater than the current threshold, a difference between the first and second set point values being determined based on a difference between the current and the current threshold.

According to an embodiment, when the first voltage is smaller than the first value of the low threshold at the end of the first period, the first circuit is configured to control a turning off of the switch and then deliver successive values of the second set point value, the successive values being decreasing and ranging from the current value of the first set point value to a default value of the second set point value.

According to an embodiment, the interface is configured to negotiate a supply power to be delivered to a load, preferably by implementing a USB-PD technology, when the load is connected to the interface.

According to an embodiment, when the supply power to be delivered is renegotiated, the first circuit is configured to deliver successive values of the second set point value monotonously varying between a value of the second set point value determined by the negotiated power and a value of the second set point value determined by the renegotiated power.

According to an embodiment, when the switch is conductive and the supply power to be delivered has been negotiated, the second set point value is determined by the negotiated power.

According to an embodiment, the first circuit comprises at least one digital-to-analog converter and one digital control unit configured to control the at least one digital-to-analog converter so that the at least one digital-to-analog converter delivers the values of the high and low thresholds.

According to an embodiment, the control unit is further configured to control the at least one digital-to-analog converter so that the at least one digital-to-analog converter delivers the values of the second set point value.

A further embodiment provides a method implemented in a power supply interface, the method comprising:
a delivery of a first DC voltage on a first terminal of the interface;
a delivery, by a comparator of the interface, of a first signal representative of a comparison of the first voltage with a high threshold;
a delivery, by a comparator of the interface, of a second signal representative of a comparison of the first voltage with a low threshold;
a detection, by a first circuit of the interface, that the first voltage becomes smaller than a first value of the low threshold based on the second signal;

a delivery, by the first circuit, of successive pairs of values of the high and low thresholds for a first time period after the detection;

a modification, by the first circuit, of the values of the high and low thresholds between two successive pairs based on the first and second signals to determine a pair of values of the high and low thresholds surrounding the first voltage; and a determination, by the first circuit, of a current value of the first voltage based on the pair of values of the high and low thresholds surrounding the first voltage.

According to an embodiment, the method further comprises:

a delivery, by a voltage converter of the interface, of a second DC voltage on a second terminal of the converter coupled to the first terminal by a resistor and a switch in series; and a delivery, by a second circuit of the interface, of a control signal to the converter such that the first voltage is equal to a first set point value.

According to an embodiment, the first circuit determines a current value of the first set point value based on the current value of the first voltage.

According to an embodiment, when the switch is conductive, the second circuit determines the control signal so that:

the first set point value is equal to a second set point value when a current in the resistor is smaller than a current threshold; and the first set point value is smaller than the second set point value when the current is greater than the current threshold, a difference between the first and second set point values being determined by a difference between the current and the current threshold.

According to an embodiment, when the first voltage is smaller than the first value of the low threshold at the end of the first time period, the first circuit controls a turning off of the switch and then delivers successive values of the second set point value, the successive values being decreasing and ranging from the current value of the first set point value to a default value of the second set point value.

According to an embodiment, the described interface is configured to implement the described method.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the various devices and applications where a power supply interface, particularly a power supply interface configured to implement the USB-PD technology, may be provided, have not been described, the described embodiments being compatible with such usual devices and applications. Further, the management of a negotiation phase concerning the supply power that an interface is supposed to deliver to a load from a power source is not detailed. Further, only the relevant aspects of the USB-C and USB-PD technologies are described, the other aspects adapting with no modifications. For example, the function of data exchange via USB-C connectors adapted to the USB-PD technology, and possibly a USB-C-type cable adapted to the USB-PD technology, is not described, the described embodiments being compatible with the usual data exchange function of the USB-C and USB-PD technologies.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
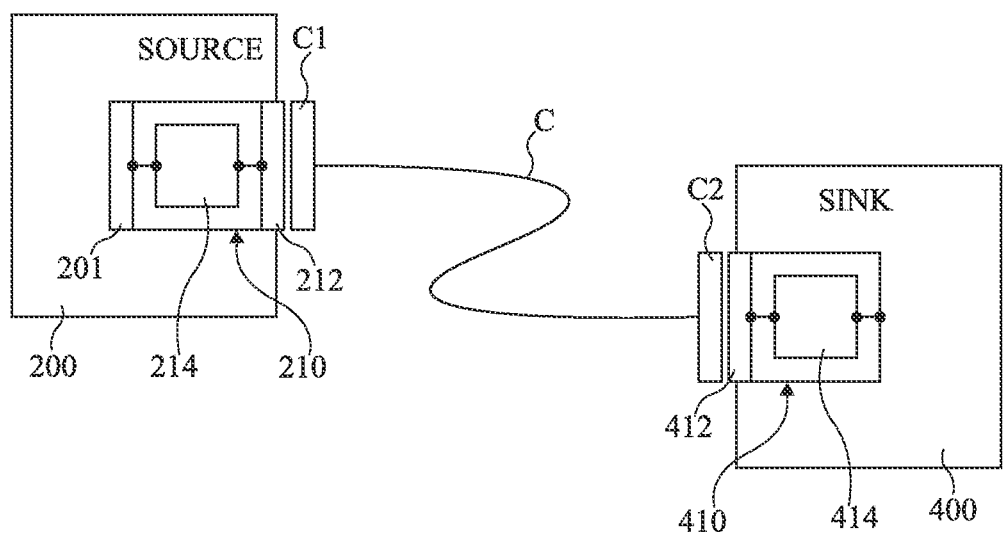
FIG. 1 is a simplified view illustrating an example of a delivery of a supply power to a load via a power supply interface coupling the load and a power source.

FIG. 1 is a simplified view illustrating an example of a delivery of a supply power to a load 400 (SINK) via a power supply interface 214 coupling charge 400 to a power source 201.

Interface 214 belongs to a device 200 having the role of a power source (SOURCE). Device 200 comprises power source 201. In the example of FIG. 1, devices 200 and 400 are connected via a C cable of USB-C type, in this example adapted to the USB-PD technology.

The power source 201 of device 200 is for example the mains or a DC power supply (DC). In the following description, it is considered as an example that power source 201 delivers a DC voltage, device 200 for example being a computer, a portable battery, etc. or any other electronic device capable of powering a device and/or of charging a battery.

The C cable comprises, at each of its ends, a USB-C-type connector C1, C2, in the present example adapted to the USB-PD technology. Connectors C1, C2 may be identical.

A connection element 210, respectively 410, comprising power supply interface 214, respectively a power supply interface 414, and a connector 212, respectively 412, is arranged on the side of device 200, respectively of device 400. Interface 214, respectively 414, couples power source 201, respectively load 400, to connector 212, respectively 412. Preferably, it is considered that connection elements 210, respectively 410, form part of power supply device 200, respectively of load 400. Each connector 212, 412 is configured to cooperate with a connector C1, C2 of cable C. Each connector 212, 414 may also be configured to cooperate with connector 412, respectively 212. Interfaces 214, 414 may be identical. Interfaces 214, 414 enable to adapt the supply power delivered by power source 201 according to the supply power required by load 400. More particularly, in the following description, interfaces 214, 414 enable to adapt the supply power delivered by power source 201 according to a reference supply power required by load 400, particularly in the case where the USB-PD technology is implemented. For this purpose, interface 214 comprises a power converter (not shown in FIG. 1), for example, a DC/DC voltage converter (DC/DC) when power source 201 delivers a DC voltage. The converter is controlled to adapt, based on power source 201, the power delivered to load 400.

During a connection managed by the USB-PD technology, interface 214 is configured to deliver a power supply voltage Vbus (not shown in FIG. 1) to load 400, voltage Vbus first having a default value, generally low, for example, 5 V. Then, a communication is established between devices 200 and 400 to decide of the supply power necessary for device 400 to be powered and/or charged. More particularly, device 400 indicates, for example, via its interface 414, the minimum power required for its operation and device 200 indicates, for example, via its interface 214, the supply powers that it is capable of delivering. A negotiation managed, in the present example, by the USB-PD technology, then starts in order to define what power will be delivered by device 200 to device 400.

The negotiated supply power is selected from a predefined list of supply powers. The list is for example recorded in interface 214. Preferably, the list is defined by a standard. Each supply power in the list is characterized by a plurality of values, particularly by a target value or set point value Vtarget of voltage Vbus that device 200 is supposed to deliver to load 400 and by a current threshold Ith, or maximum current, that load 400 is allowed to draw from device 200. In the USB-PD technology, each set of values characterizing a predefined supply power in the list corresponds to a set of information designated by initials PDO ("Power Data Object"), and such PDO sets of information can be transmitted between devices 200 and 400 adapted to the USB-PD technology to define, during a negotiation, which of the predefined powers should be delivered by device 200 to load 400.

Once the negotiation is ended, connection interface 214 adapts the supply power of power source 201 according to the result of the negotiation, after which the power supply of device 400 starts. The voltage converter of interface 214 is then controlled by interface 214 in accordance with the result of the negotiation, to adapt the power of power source 201 to the negotiated power.

In particular, as long as a the current I (not shown in FIG. 1) drawn by load 400 is smaller than the current threshold Ith corresponding to the negotiated power, interface 214 controls its converter, via a control signal cmd (not shown in FIG. 1), so that the voltage Vbus delivered to load 400 is equal to a target value Vtarget' then equal to the target value Vtarget defined by the negotiated power. This operation is generally called constant voltage operation. For this purpose, interface 214 comprises a voltage feedback loop configured to deliver control signal cmd to the converter. More precisely, the voltage feedback loop is configured to adapt or modify signal cmd based on a difference between target value Vtarget' and voltage Vbus or, in other words, based on a difference between a signal representative of value Vtarget' and a signal representative of voltage Vbus.

Further, when load 400 draws a current I greater than the current threshold Ith defined by the negotiated power, interface 214 is configured to decrease target value Vtarget'. Interface 214 is further configured to accordingly adapt or modify signal cmd so that voltage Vbus is equal to target value Vtarget'. In other words, when current I is greater than threshold Ith, the interface is configured to decrease the delivered voltage Vbus. This decrease in voltage Vbus is implemented to avoid for device 200 to deliver a power greater than the negotiated power. This operation is generally called constant current operation. For this purpose, interface 214 comprises a current feedback loop configured to modify, and preferably to decrease, value Vtarget' with respect to value Vtarget when current I is greater than threshold Ith. The decrease of value Vtarget' is then determined based on a difference between current I and threshold Ith or, in other words, based on a difference between a signal representative of current I and a signal representative of threshold Ith. Still in other words, the current feedback loop is configured to deliver, to the voltage feedback loop, a target voltage value Vtarget' corresponding to the target value Vtarget modified based on the difference between current I and threshold Ith.

Further, interface 214 comprises a first comparator (not shown in FIG. 1) configured to compare voltage Vbus with a high OVLO threshold or, in other words, to compare a signal representative of voltage Vbus with a signal representative of the OVLO threshold. The interface also comprises a second comparator (not shown in FIG. 1) configured to compare voltage Vbus with a low UVLO threshold or, in other words, to compare a signal representative of voltage Vbus with a signal representative of the UVLO threshold. The UVLO ("Under Voltage Lock Out") and OVLO ("Over Voltage Lock Out") thresholds are respectively smaller than value Vtarget and greater than value Vtarget, and are determined by the negotiated power. As an example, the UVLO threshold is equal to 90% of value Vtarget and the OVLO threshold is equal to 110% of value Vtarget.

The case where current I increases with respect to threshold Ith until voltage Vbus becomes smaller than the UVLO threshold is considered. If, after a timing period has elapsed since the time when voltage Vbus becomes smaller than the UVLO threshold, voltage Vbus is still smaller than this UVLO threshold, interface 214 is configured to turn on a switch SW (not shown in FIG. 1) connected between the voltage converter of interface 214 and an output terminal of interface 214 delivering voltage Vbus. After this, interface 214 updates target value Vtarget so that it is equal to a default value, for example, 5 V. In other words, value Vtarget is switched from a first value Vtarget1 determined by the negotiated power to a second value Vtarget2, here equal to the default value. Further, since switch SW is off, current I is smaller than threshold Ith and value Vtarget' is equal to value Vtarget.

Such a switching of value Vtarget, and thus of value Vtarget', may cause unwanted and/or poorly controlled variations of signal cmd. Such variations of signal cmd may cause a malfunction of the voltage converter of interface 214, for example, they may cause the passage of the converter to a configuration mode, which raises an issue.

To avoid unwanted variations of signal cmd, the inventors here provide, when voltage Vbus is smaller than the UVLO threshold at the end of the timing period, progressively and monotonously varying the target value Vtarget from value Vtarget' at the end of the timing period to the default value of value Vtarget. Target value Vtarget then takes a plurality of successive decreasing intermediate values between value Vtarget' at the end of the timing period and the default value of target value Vtarget. Since switch SW is off, value Vtarget' then progressively varies from its value at the end of the timing period to the default value of value Vtarget. As a result, signal cmd also progressively varies, in controlled fashion, which avoids malfunctions of the converter of interface 214.

For this purpose, it is desirable for a circuit of interface 214 delivering value Vtarget, that is, the values taken by set point value Vtarget, to know value Vtarget' at the end of the timing period.

The inventors here provide taking advantage of the timing period and of the first and second comparators of interface 214 configured to compare voltage Vbus with the respective UVLO and OVLO thresholds to determine a current value of voltage Vbus at the end of the timing period. Knowing the current value of voltage Vbus at the end of the timing period then enables to determine value Vtarget' at the end of this timing period.

More particularly, the inventors here provide modifying the values of the UVLO and OVLO thresholds during the timing period to determine a pair of a UVLO threshold value and of a OVLO threshold value surrounding voltage Vbus, that is, a pair of a value of the UVLO threshold smaller than voltage Vbus and of a value of the OVLO threshold greater than voltage Vbus. Indeed, it is then possible to deduce a current value of voltage Vbus from the value of the UVLO threshold smaller than voltage Vbus and from the value of the OVLO threshold greater than voltage Vbus.

According to an embodiment, the inventors provide an interface of the type of interface 214, comprising a circuit configured to deliver successive pairs of values of the UVLO and OVLO thresholds during the timing period. This circuit is configured to modify the values of the high and low thresholds between two successive pairs of values, based on the output signals of the first and second comparators of the interface, to determine a pair of values of the OVLO and UVLO thresholds surrounding voltage Vbus. This circuit is further configured to determine the current value of voltage Vbus based on the pair of values of the OVLO and UVLO thresholds surrounding voltage Vbus.

Figure 2:
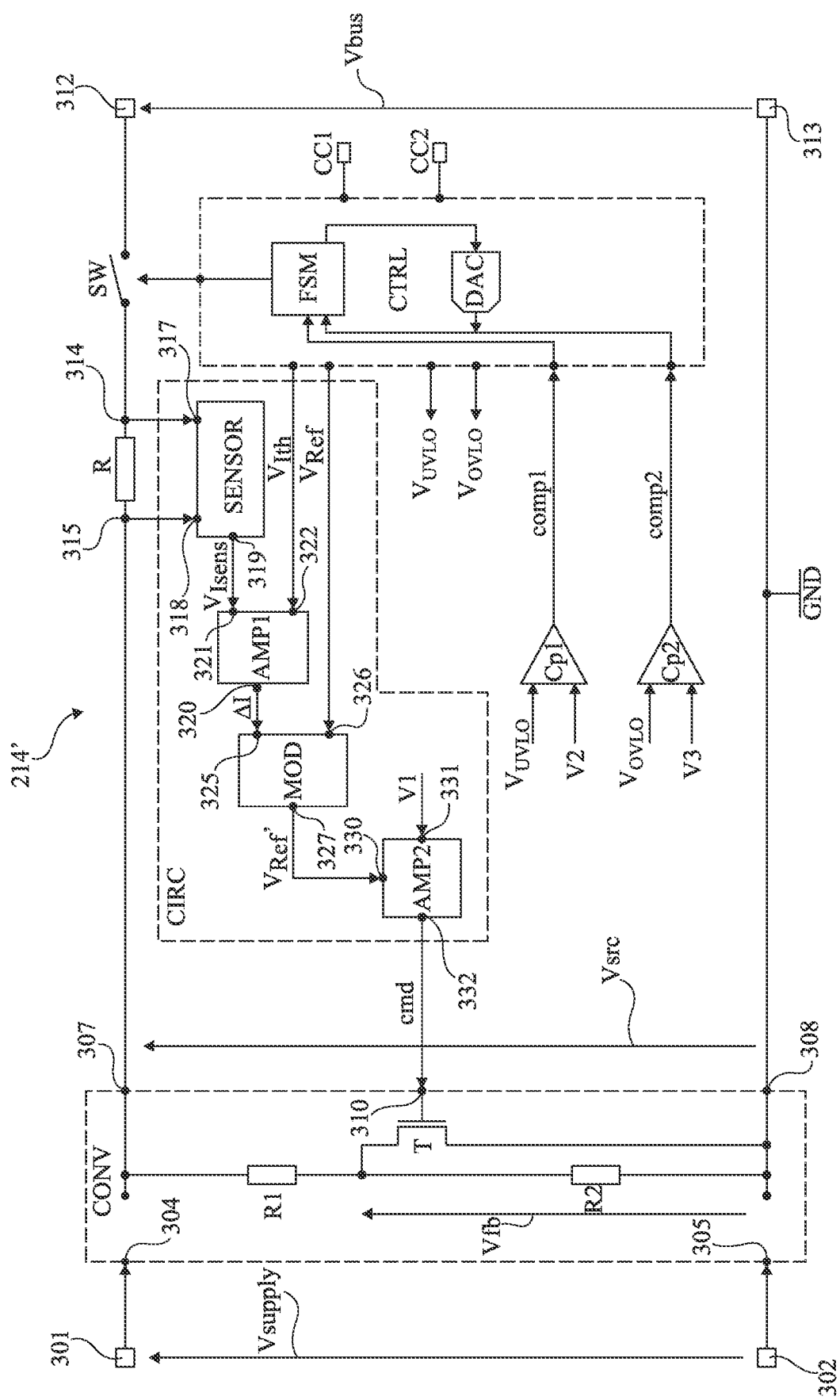
FIG. 2 schematically shows in the form of blocks an embodiment of a power supply interface of the type of that in FIG. 1.

FIG. 2 schematically shows an embodiment of such an interface, the interface being referenced 214' and for example replacing interface 214 in FIG. 1.

Interface 214' comprises two input terminals 301 and 302 intended to receive a power supply voltage Vsupply from power source 201 (FIG. 1). Voltage Vsupply is for example a DC voltage, for example, referenced to terminal 302.

Interface 214' comprises a voltage converter CONV, or power converter, delimited by dotted lines in FIG. 2. Converter CONV comprises two input terminals 304 and 305 coupled, preferably connected, to respective terminals 301 and 302, to receive voltage Vsupply.

Converter CONV comprises an output terminal 307 configured to supply a DC voltage Vsrc, voltage Vsrc being for example referenced to another output terminal 308 of converter CONV, set to a reference potential GND, typically the ground.

Converter CONV is controlled by control signal cmd, signal cmd being received by a terminal 310 of converter CONV. More particularly, signal cmd determines a value of voltage Vsrc that converter CONV should deliver.

Interface 214' comprises a resistor R and switch SW series-connected between terminal 307 and an output terminal 312 of interface 214'. Terminal 312 is configured to deliver voltage Vbus when switch SW is on. Voltage Vbus is for example referenced with respect to an output terminal 313 of interface 214' set to reference potential GND. Terminal 313 is coupled, preferably connected, to terminal 308 of converter CONV. The value of voltage Vbus is determined by that of voltage Vsrc, and thus by signal cmd. In other words, signal cmd is representative of the set point value Vtarget' of voltage Vbus.

Resistor R is coupled, preferably connected, to terminal 307, switch SW being coupled, preferably connected, to terminal 312. When it is off, switch SW is configured to electrically isolate terminal 312 from terminal 307 or, in other words, to interrupt the power supply of a load coupled to interface 214'. When switch SW is off, voltage Vbus is for example available on a node 314 of connection of resistor R to switch SW.

Interface 214' further comprises a circuit CTRL, delimited by dotted lines in FIG. 2. Circuit CTRL is a circuit for controlling interface 214'.

Circuit CTRL comprises at least one terminal coupled, preferably connected, to at least one communication terminal of interface 214'. Output terminals 312, 313 and the communication terminals of interface 214' are all intended to be coupled to the corresponding connector 212 (FIG. 1), which then allows the coupling with load 400 (FIG. 1), for example, via connector C1, cable C, and connector C2, as shown in FIG. 1. During a phase of negotiation of a supply power, the communication between interface 214' and load 400 to be powered is at least partly implemented by circuit CTRL, via the communication terminals of interface 214'.

Preferably, interface 214' comprises two communication terminals CC1, CC2 coupled, preferably connected, each to a corresponding terminal of circuit CTRL. An advantage of having two communication terminals CC1 and CC2 is that, in the case where terminals CC1 and CC2 are symmetrically positioned on connector 212, this enables to manufacture a reversible connector C1, that is, a connector C1, for example of rectangular shape, capable of being coupled to connector 212 in a first direction and in a second direction opposite to the first one.

Circuit CTRL is configured to control switch SW. In particular, circuit CTRL is configured to turn off switch SW when voltage Vbus falls below the UVLO threshold and is still under the UVLO threshold at the end of the timing period. Preferably, circuit CTRL is further configured to turn off switch SW when voltage Vbus exceeds the OVLO threshold.

Circuit CTRL is further configured to deliver the UVLO and OVLO thresholds or, in other words, to deliver values of the UVLO and OVLO thresholds. More particularly, in this example, circuit CTRL is configured to deliver a signal VUVLO representative of the UVLO threshold or, in other words, of the value of the UVLO threshold, and to deliver a signal VOVLO representative of the OVLO threshold or, in other words, of the value of the OVLO threshold. In another example, not illustrated, circuit CTRL is configured to deliver a same signal which is representative of the two UVLO and OVLO thresholds, this signal being for example more generally representative of the set point value Vtarget of voltage Vbus.

Interface 214' comprises a capacitor Cp1 configured to compare voltage Vbus with the UVLO threshold. In other words, comparator Cp1 is configured to compare a signal representative of the UVLO threshold, in this example, signal VUVLO, with a signal representative of voltage Vbus, in this example a signal V2. An output signal comp1 of comparator Cp1 indicates the result of this comparison. Signal comp1 is delivered to circuit CTRL.

Symmetrically, interface 214' comprises a capacitor Cp2 configured to compare voltage Vbus with the OVLO threshold. In other words, comparator Cp2 is configured to compare a signal representative of the OVLO threshold, in this example, signal VOVLO, with a signal representative of voltage Vbus, in this example a signal V3. An output signal comp2 of comparator Cp2 indicates the result of this comparison. Signal comp2 is delivered to circuit CTRL.

Circuit CTRL is further configured to deliver a signal VIth representative of the current threshold Ith determined by the negotiated power, and a signal VRef representative of target value Vtarget.

Interface 214' further comprises a circuit CIRC, delimited by dotted lines in FIG. 2. Circuit CIRC is configured to deliver signal cmd to converter CONV.

Circuit CIRC is configured to determine signal cmd so that, when switch SW is on and current I is smaller than threshold Ith, set point value Vtarget' is equal to set point value Vtarget. Circuit CIRC is further configured to determine signal cmd so that, when switch SW is on and current I is greater than threshold Ith, set point value Vtarget' is smaller than set point value Vtarget. In this last case, a difference between set point values Vtarget' and Vtarget is determined based on a difference between current I and threshold Ith.

In other words, circuit CIRC is configured to deliver, based on the signal VRef representative of value Vtarget and on a signal ΔI representative of a difference between current I and threshold Ith, a signal VRef representative of value Vtarget', and to deliver signal cmd based on a difference between signal VRef and on a signal representative of voltage Vbus, in this example, a signal V1. Signal V1 is for example delivered by a voltage dividing bridge connected between terminal 307 and terminal 308, between node 314 and terminal 308, or between terminal 312 and terminal 313.

According to an embodiment, circuit CIRC comprises a circuit SENSOR configured to deliver a value of current I. In other words, circuit SENSOR is configured to deliver a signal VIsens representative of the value of current I. Circuit SENSOR, for example, a transimpedance amplifier, comprises a terminal 317 coupled, preferably connected, to node 314, and a terminal 318 coupled, preferably connected, to a terminal 315 of resistor R coupled, for example, connected, to terminal 307 of converter CONV. In other words, the terminals 317 and 318 of circuit SENSOR are configured to receive the voltage across resistor R. Circuit SENSOR further comprises a terminal 319 configured to deliver signal VIsens. Preferably, signal VIsens is a voltage having a value varying according to the value of current I, for example, a voltage having its value increasing when the value of current I increases.

According to an embodiment, circuit CIRC comprises a circuit AMP1, for example, an error amplifier, configured to deliver a value representative of the difference between current I and threshold Ith. In other words, circuit AMP1 comprises a terminal 320 configured to deliver the signal ΔI representative of this difference. Preferably, signal ΔI is a voltage having a value varying according to the value of the difference between current I and threshold Ith, for example, a voltage having a value which increases when the value of current I increases and is greater than threshold Ith. To determine the difference between current I and threshold Ith, circuit AMP1 comprises a terminal 321 configured to receive a value of current I, and a terminal 322 configured to receive a value of threshold Ith. In other words, terminal 321 is configured to receive a signal representative of the value of current I, in this example, signal VIsens, terminal 322 being configured to receive a signal representative of the value of threshold Ith, in this example, signal VIth.

According to an embodiment, circuit CIRC comprises a circuit MOD configured to deliver value Vtarget' based on value Vtarget and on the difference between current I and threshold Ith. In other words, circuit MOD is configured to deliver a signal representative of value Vtarget', in this example signal VRef, based on a signal representative of the difference between current I and threshold Ith, in this example signal ΔI, and based on a signal representative of value Vtarget, in this example, signal VRef. Circuit MOD comprises a terminal 325 configured to receive the value of the difference between current I and threshold Ith, that is, signal ΔI in this example, a terminal 326 configured to receive value Vtarget, that is, signal VRef in this example, and a terminal 327 configured to deliver value Vtarget', that is, signal VRef in this example. Preferably, signal VRef is a voltage having its value varying according to signals VRef and ΔI, for example, a voltage having its value decreasing when the value of voltage ΔI increases.

According to an embodiment, circuit CIRC comprises a circuit AMP2, for example, an error amplifier, configured to deliver signal cmd based on value Vtarget' and on the current value of voltage Vbus. In other words, circuit AMP2 is configured to deliver signal cmd based on a signal representative of value Vtarget', in this example signal VRef, and based on a signal representative of the value of voltage Vbus, in this example, a signal V1. Circuit AMP2 comprises a terminal 330 configured to receive value Vtarget', that is, configured to receive signal VRef in this example, a terminal 331 configured to receive the value of voltage Vbus, that is, signal V1 in this example, and a terminal 332 configured to deliver signal cmd. Preferably, signal cmd is a voltage having its value varying according to signals VRef and V1, for example, a voltage having its value increasing when the value of voltage VRef decreases while voltage V1 remains substantially constant.

The implementation of circuits SENSOR, AMP1, MOD, and AMP2, and more generally of circuit CIRC, is within the abilities of those skilled in the art based on the functional indications given hereinabove.

In interface 214', circuit CTRL is further configured, during the timing period following the falling of voltage Vbus under the UVLO threshold, to deliver successive pairs of a value of the high OVLO threshold and of a value of the low UVLO threshold. More particularly, circuit CTRL is configured, during this timing period, to modify the values of the OVLO and UVLO thresholds between two pairs of successively delivered values. Such a modification of the values of the OVLO and UVLO thresholds is based on signals comp1 and comp2 and is implemented to determine a pair of values of the OVLO and UVLO thresholds by surrounding voltage Vbus. Circuit CTRL is then configured to determine a current value of voltage Vbus based on the pair of values of the OVLO and UVLO thresholds surrounding voltage Vbus.

According to an embodiment, when a first pair of values of the OVLO and UVLO thresholds is delivered by circuit CTRL, the values of the OVLO and UVLO thresholds of a second pair delivered after the first pair are modified as follows:
the values of the UVLO and OVLO thresholds of the second pair are increased with respect to those of the first pair if voltage Vbus is greater than the OVLO threshold of the first pair; and the values of the UVLO and OVLO thresholds of the second pair are decreased with respect to those of the first pair if voltage Vbus is smaller than the UVLO threshold of the first pair.

According to an embodiment, when the values of the OVLO and UVLO thresholds of the first pair surround voltage Vbus, the values of the OVLO and UVLO thresholds are respectively decreased and increased. This enables to obtain a more accurate current value of voltage Vbus.

According to an embodiment, at the end of the timing period, circuit CTRL is configured to determine a current value of set point value Vtarget' based on the previously determined current value of voltage Vbus. As an example, interface 214' is configured so that voltage Vbus is equal to A*VRef, A being the gain of the loop comprising converter CONV and circuit AMP2. In this example, the determination of the current value of voltage Vbus and the knowledge of gain A enables to deduce a corresponding current value of signal VRef, and thus to deduce a corresponding current value of value Vtarget'.

According to an embodiment, at the end of the timing period, if voltage Vbus is smaller than the UVLO threshold determined, or defined, by the negotiated power, circuit CTRL is configured to control a turning off of switch SW. The circuit is also configured to then deliver successive decreasing values Vtarget, these successive values ranging from the previously-determined current value of value Vtarget' to the default value of value Vtarget. Thus, value Vtarget takes a plurality of successive decreasing intermediate values between the previously-determined current value Vtarget' and the default value Vtarget.

UVLO threshold determined or defined by the negotiated power here means the UVLO threshold delivered by circuit CTRL at the time when the timing period starts due to the fact that voltage Vbus has fallen under this UVLO threshold or, in other words, the UVLO threshold delivered by circuit CTRL and having voltage Vbus compared therewith to determine whether a timing period should or not start.

According to an embodiment, as shown in FIG. 2, circuit CTRL comprises at least one digital control unit, or digital control circuit, FSM, for example, a circuit FSM implementing a finite state machine and at least one digital to analog converter DAC, a single DAC circuit being shown in FIG. 2. In this embodiment, circuit FSM receives signals comp1 and comp2 and delivers the signal for controlling switch SW. Further, in this embodiment, circuit FSM is configured to implement the above-described operation. More particularly, circuit FSM is configured to control the DAC circuit(s) so that the DAC circuits(s) deliver the different values of the UVLO and OVLO thresholds, that is, signals VUVLO and VOVLO in the example of FIG. 2. Preferably, circuit FSM is further configured to control the DAC circuit(s) so that the DAC circuit(s) also deliver the values Vtarget, that is, signal VRef in the example of FIG. 2, as well as the threshold Ith, that is, the voltage VIth. As an example, a first circuit DAC provides the threshold Ith, that is, the voltage VIth, and a second circuit DAC provides the value Vtarget and the thresholds UVLO and OVLO. More particularly, in the present example, the second circuit DAC provides the voltage VRef representative of the value Vtarget, and the voltages VUVLO and VOVLO are equal to voltage VRef.

The voltages V2 and V3 are obtained by means of a voltage divider bridge from voltage Vbus, so that the comparison of voltage VRef with voltage V2 amounts to compare voltage Vbus with threshold UVLO, and that the comparison of voltage VRef with voltage V3 amounts to compare voltage Vbus with threshold OVLO. In this case, it is understood that when thresholds UVLO and OVLO, thus voltage VRef, are modified in a recursive manner to determinate the value of voltage Vbus, the current value of the voltage Vbus is forced by the current feedback loop, which tends to impose a current I equal to threshold Ith. Thus, during this search phase of the value of the voltage Vbus, the modifications of the voltage VRef to modify thresholds UVLO and OVLO have no influence on the current value of voltage Vbus.

Preferably, when circuit CTLR delivers successive decreasing values Vtarget, ranging from a first value Vtarget1, for example, the previously-determined current value of value Vtarget', to a second value Vtarget2, for example, the default value of value Vtarget, circuit CTRL is configured to turn off switch SW and turn on another switch (not shown). The turning on of this other switch enables to discharge voltage Vsrc, and thus voltage Vbus, to ground GND, through a discharge resistor (not shown). In practice, voltage Vsrc corresponds to the voltage across an output capacitor (not shown) of converter CONV. Thus, voltage Vsrc discharges at a speed conditioned by value Res of the discharge resistor and by value C of the output capacitor of converter CONV. It will be within the abilities of those skilled in the art, based on the above functional indications and particularly on a time constant equal to the product of values Res and C, to determine the maximum slope of the corresponding voltage VRef to ascertain that error amplifier AMP2 operates in regulation mode all along the period when value Vtarget progressively passes from value Vtarget1 to value Vtarget2. Preferably, the slope of voltage VRef is then determined from time constant R.C to avoid exceeding, in absolute value, the slope of voltage Vbus during the discharge.

According to an embodiment, when voltage VRef passes from a value VRef1 representative of value Vtarget1 to a value VRef2 representative of value Vtarget2, circuit FSM, for example, rated by a clock signal of period T, is configured to successively deliver to the DAC circuit delivering voltage VRef a binary code B1 corresponding to value VRef1 of voltage VRef, a plurality of binary codes B, and a binary code B2 corresponding to value VRef2 of voltage VRef. More particularly, the binary codes B are delivered so that the corresponding values of voltage VRef are decreasing. Thus, signal VRef corresponds to a voltage ramp, and more particularly herein a stepped voltage ramp, decreasing between values VRef1 and VRef2. Preferably, circuit CTRL updates the binary code at each period T of its clock signal. Preferably, circuit CTRL successively delivers all the binary codes B between codes B1 and B2.

As an example, as illustrated in FIG. 2, converter CONV comprises two resistors R1 and R2 in series between its terminals 307 and 308, resistor R1 being connected to terminal 307 and resistor R2 being connected to terminal 308. Still in this example, converter CONV comprises a transistor T, for example, a MOS ("Metal Oxide Semiconductor") transistor, for example, an N-channel or NMOS transistor, connected in parallel with resistor R2 and having its control terminal (gate) coupled, preferably connected, to terminal 310. A voltage Vfb across resistor R2 is then used as a voltage for controlling circuits (not shown) of converter CONV.

In this example, when voltage Vtarget progressively passes, in the form of a ramp, from value VRef1 to value VRef2, this enables to avoid for error amplifier AMP2 to saturate. If voltage VRef had been switched, in all or nothing, between value VRef1 and value VRef2, error amplifier AMP2 would have saturated, which would have resulted in a blocking of transistor T and in an overvoltage on voltage Vfb. This overvoltage on voltage Vfb is not desirable, for example, because voltage Vfb might then exceed a threshold beyond which converter CONV enters a configuration phase.

Figure 3:
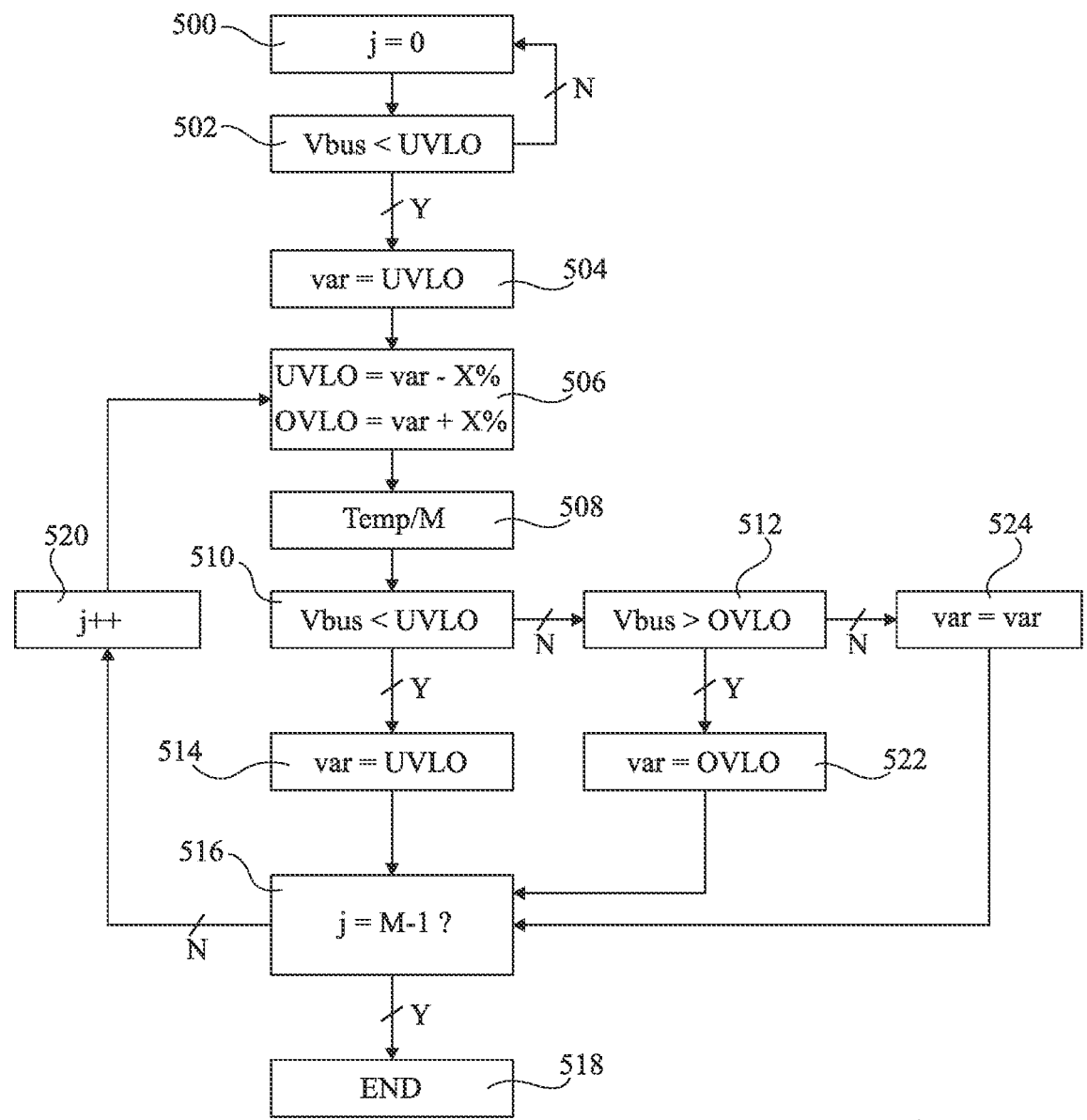
FIG. 3 shows in the form of blocks an embodiment of a method for example implemented in the interface of FIG. 2.

FIG. 3 shows, in the form of blocks, an embodiment of a method, for example, implemented in interface 214' of FIG. 2, for example, by circuit CTRL, for example, by the FSM circuit of circuit CTRL. More particularly, FIG. 3 illustrates in more detailed fashion an embodiment of the method implemented during the timing period, to determine a current value of voltage Vbus.

At an initial step 500 (block j=0), a loop variable j is initialized, in this example to 0, j being an integer from 0 to M−1 in this example.

A next step 502 (block Vbus<UVLO) comprises determining whether voltage Vbus is or not smaller than the UVLO threshold determined by the negotiated power. If voltage Vbus is greater than the UVLO threshold (branch N of block 502), the method carries on at step 500 or, as a variation, step 502 is repeated. If voltage Vbus is smaller than the UVLO threshold (Y branch of block 502), the method carries on at a step 504 (block var=UVLO).

At step 504, a variable var, for example, stored in a register, not shown, of circuit CTRL (FIG. 2), receives the current value of the UVLO threshold below which voltage Vbus has just passed.

At a next value 506 (block UVLO=var−X % OVLO=var+X %), the values of the OVLO and UVLO thresholds are modified. More particularly, the value of the OVLO threshold is set to the value of variable var plus a determined quantity, for example, equal to X % of the value of variable var, X being for example equal to 10. Symmetrically, the value of the UVLO threshold is set to the value of variable var minus a determined quantity, for example, equal to X % of the value of variable var.

A next step 508 (block Temp/M) comprises waiting until a time period corresponding to a fraction of timing period Temp has elapsed, this fraction of period Temp being for example equal to Temp/M. Once this fraction of period Temp has elapsed, the method carries on to a step 510 (block Vbus<UVLO).

Step 510 comprises determining whether voltage Vbus is or not smaller than the UVLO threshold, having a value now different from that determined by the negotiated power. If voltage Vbus is smaller than the UVLO threshold (branch Y of block 510), the method carries on to a step 514 (block var=UVLO).

At step 514, variable var is updated with the current value of the UVLO threshold, after which the method carries on to a step 516 (block j=M−1?).

Step 516 comprise verifying whether the loop variable j is equal to M−1, that is, verifying whether the timing period Temp has elapsed. If it has (branch Y of block 516), the method ends at a step 518 (block END). Otherwise (branch N of block 516), the method carries on to a step 520 (block j++) when variable j is incremented by one, before carrying on the implementation of the method at step 506 when the values of the pair of values of the UVLO and OVLO thresholds are updated.

Referring again to step 510, if voltage Vbus is greater than the UVLO threshold (branch N of block 510), the method carries on to a step 512 (block Vbus>OVLO).

Step 512 comprises determining whether voltage Vbus is or not greater than the OVLO threshold, having a value now different from that determined by the negotiated power.

If voltage Vbus is greater than the OVLO threshold (branch Y of block 512), the method carries on to a step 522 (block var=OVLO). At step 522, variable var is updated with the current value of the OVLO threshold, after which the method carries on at step 516.

However, if voltage Vbus is smaller than the OVLO threshold (branch N of block 512), this means that the pair of current values of the UVLO and OVLO thresholds surrounds voltage Vbus.

The method then carries on to a step 524 (block var=var) when the value of variable var is left unchanged or, in other words, the value of variable var is updated with its current value. The implementation of the method then carries on to step 516. As a variation, step 524 is omitted and the method directly carries on to step 516.

Thus, as long as the loop variable j is not equal to M−1 and as long as the UVLO and OVLO thresholds do not surround voltage Vbus, the values of the UVLO and OVLO thresholds are modified at each iteration of the loop of the method or, in other words, two successive pairs of values of the OVLO and UVLO thresholds have different UVLO and OVLO threshold values.

It will be within the abilities of those skilled in the art to select the value of integer M so that the implementation of the above method leads to obtaining a pair of values of the UVLO and OVLO thresholds surrounding voltage Vbus. As an example, for a duration Temp of 5 ms, and in the case where the response time of interface 214' is 100 s, integer M is for example 50.

Figure 4:
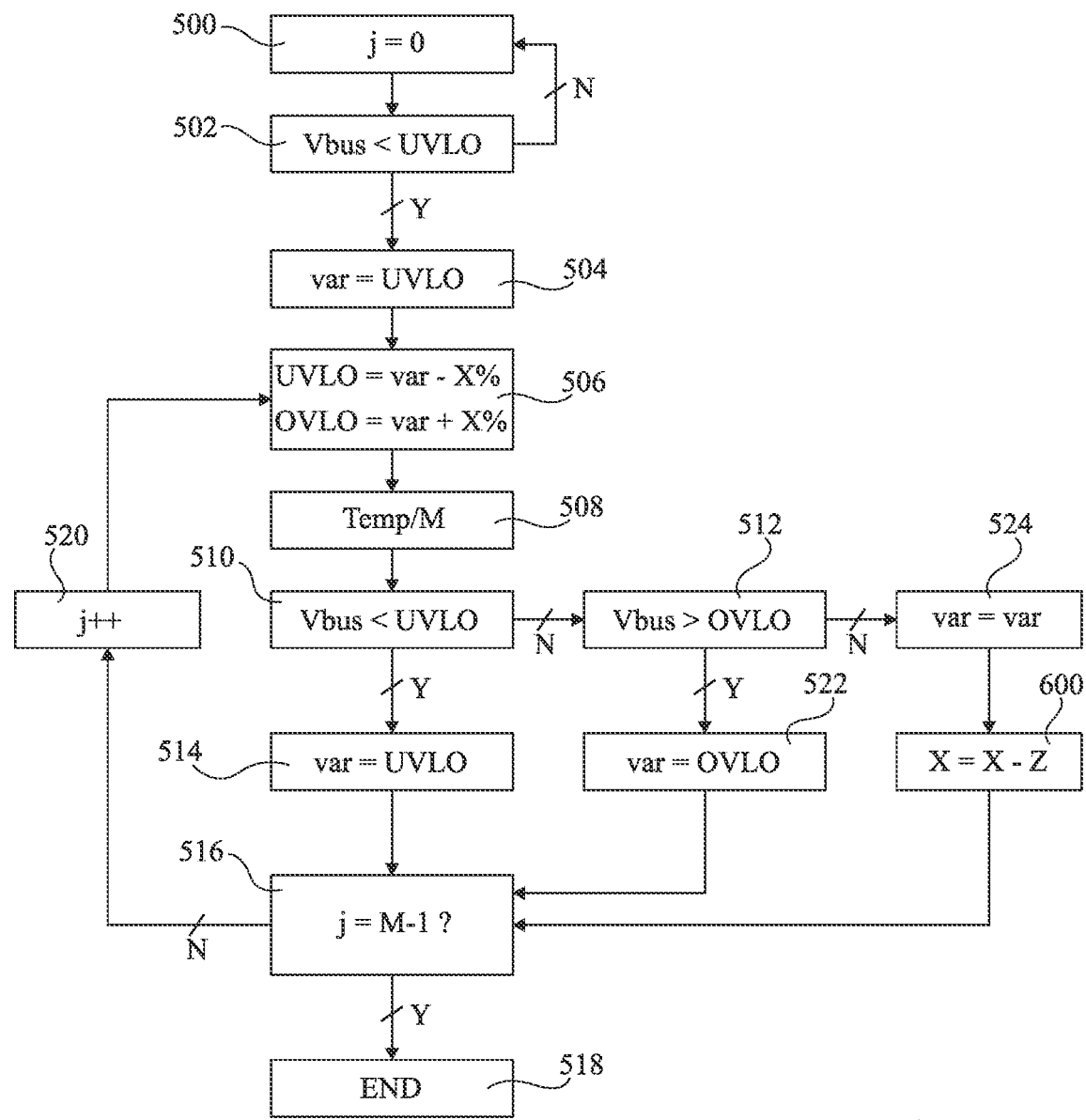
FIG. 4 shows in the form of blocks an alternative embodiment of the method of FIG. 3, for example, implemented in the interface of FIG. 2.

FIG. 4 shows in the form of blocks an alternative embodiment of the method of FIG. 3. Only the differences between the embodiment described in relation with FIG. 3 and the alternative embodiment described in relation with FIG. 4 are here highlighted.

In particular, in this alternative embodiment, when voltage Vbus is smaller than the OVLO threshold at step 512 (branch N of block 512), before step 516, for example, after the possible step 524, a step 600 (block X=X−Z) is implemented. This step 600 comprises modifying the determined quantity subtracted from variable var on update of the UVLO threshold at step 506 and the determined quantity added to variable var on update of the OVLO threshold at step 506. For example, step 600 comprises decreasing value X by a quantity Z, this quantity Z being for example equal to 1.

Thus, once a first pair of values of the UVLO and OVLO thresholds surrounding voltage Vbus has been determined, this enables to increase the value of the UVLO threshold and to decrease the value of the OVLO threshold of the next pair of values of the UVLO and OVLO thresholds. As a result, the difference between the UVLO and OVLO thresholds surrounding voltage Vbus is smaller, which enables to determine a current value of voltage Vbus with a better accuracy.

Figure 5:
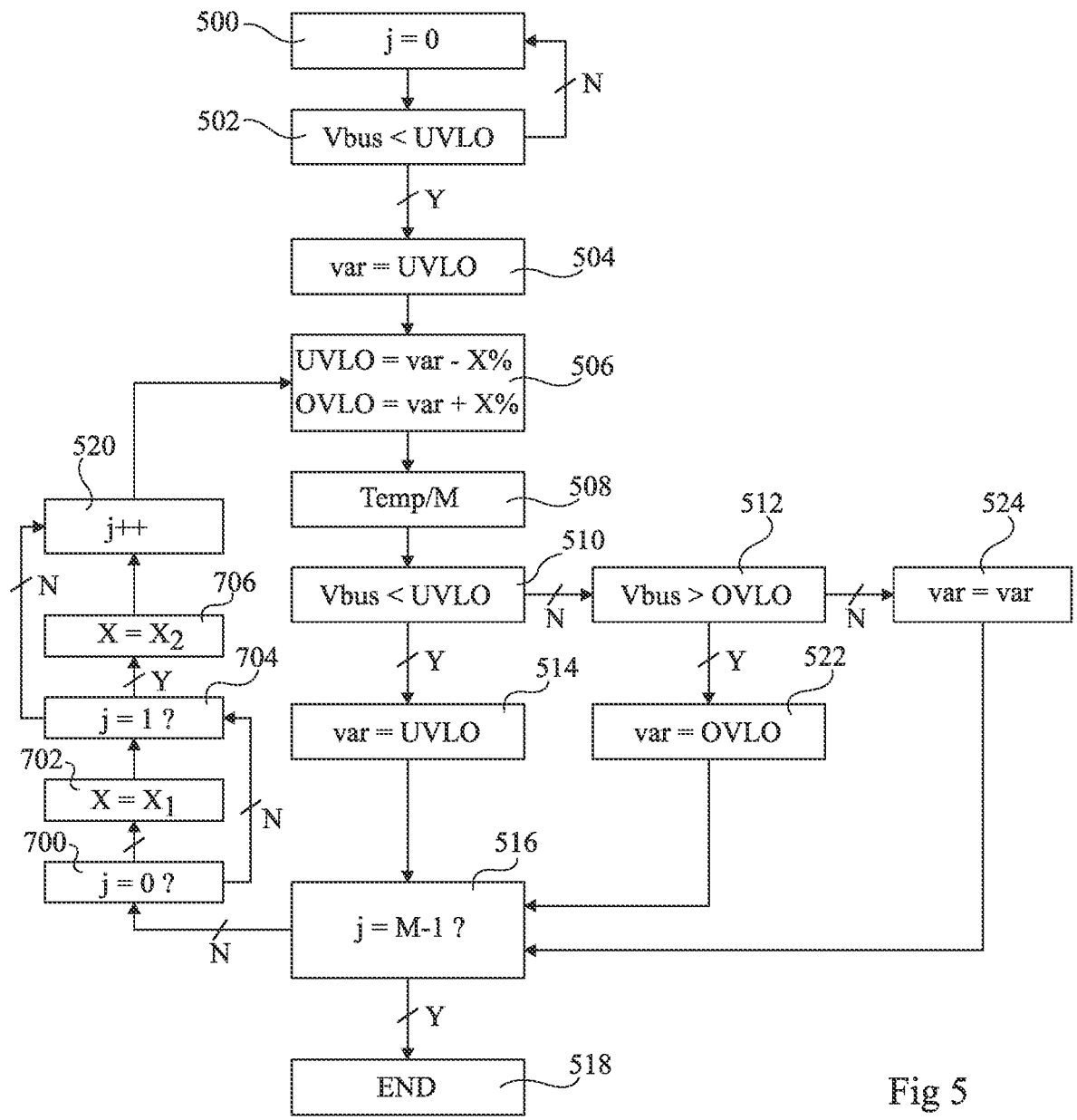
FIG. 5 shows in the form of blocks another alternative embodiment of the method of FIG. 3, for example implemented in the interface of FIG. 2.

FIG. 5 shows, in the form of blocks, another alternative embodiment of the method of FIG. 3. Only the differences between the embodiment described in relation with FIG. 3 and the alternative embodiment described in relation with FIG. 5 are here highlighted.

In particular, in this variant, as in the variant described in relation with FIG. 4, the value of the determined quantity added to, respectively subtracted from, variable var at step 506 is modified, preferably decreased, during the execution of the method. However, in this variant, each modification of this determined quantity is implemented at a given iteration of the loop of the method.

In the example of FIG. 5, a first modification is implemented between the first and second iterations of the loop of the method, and a second modification is implemented between the second and third iterations of the loop of the method.

Thus, in this example, when loop variable j is not equal to M−1 at step 516 (branch N of block 516), the method carries on at a step 700 (block j=0?) during which it is verified whether variable j has a value, in the present example a zero value, indicating that the first iteration has occurred and that the second iteration will follow.

If it has (branch Y of block 700), the method carries on to a step 702 (block X=X1) where the determined quantity added to, respectively subtracted from, variable var at step 506 is decreased, for example, by updating of current value X with a lower value X1. After step 702, the method carries on to a step 704 (block j=1?) similar to step 700.

However, if this is not true (branch N of block 700), the method directly carries on to step 704.

At step 704, it is verified whether variable j has a value, in this example equal to 1, indicating that the second iteration has occurred and that the third iteration will follow.

If it has (block Y of block 704), the method carries on to a step 706 (block X=$X_2$) where the determined quantity added to, respectively subtracted from, variable var at step 506 is decreased, for example, by updating of current value X, then equal to $X_1$, with a lower value $X_2$. After step 702, in this example, the method carries on to step 520.

However, if this is not true (branch N of block 704), in this example, the method directly carries on to step 520.

Such an alternative embodiment enables to decrease the difference between the values of the UVLO and OVLO thresholds during the execution of the method, for example, to decrease the difference between these values during each of the first iterations of the method to converge faster towards a pair of values of the UVLO and OVLO thresholds surrounding voltage Vbus.

Figure 6:
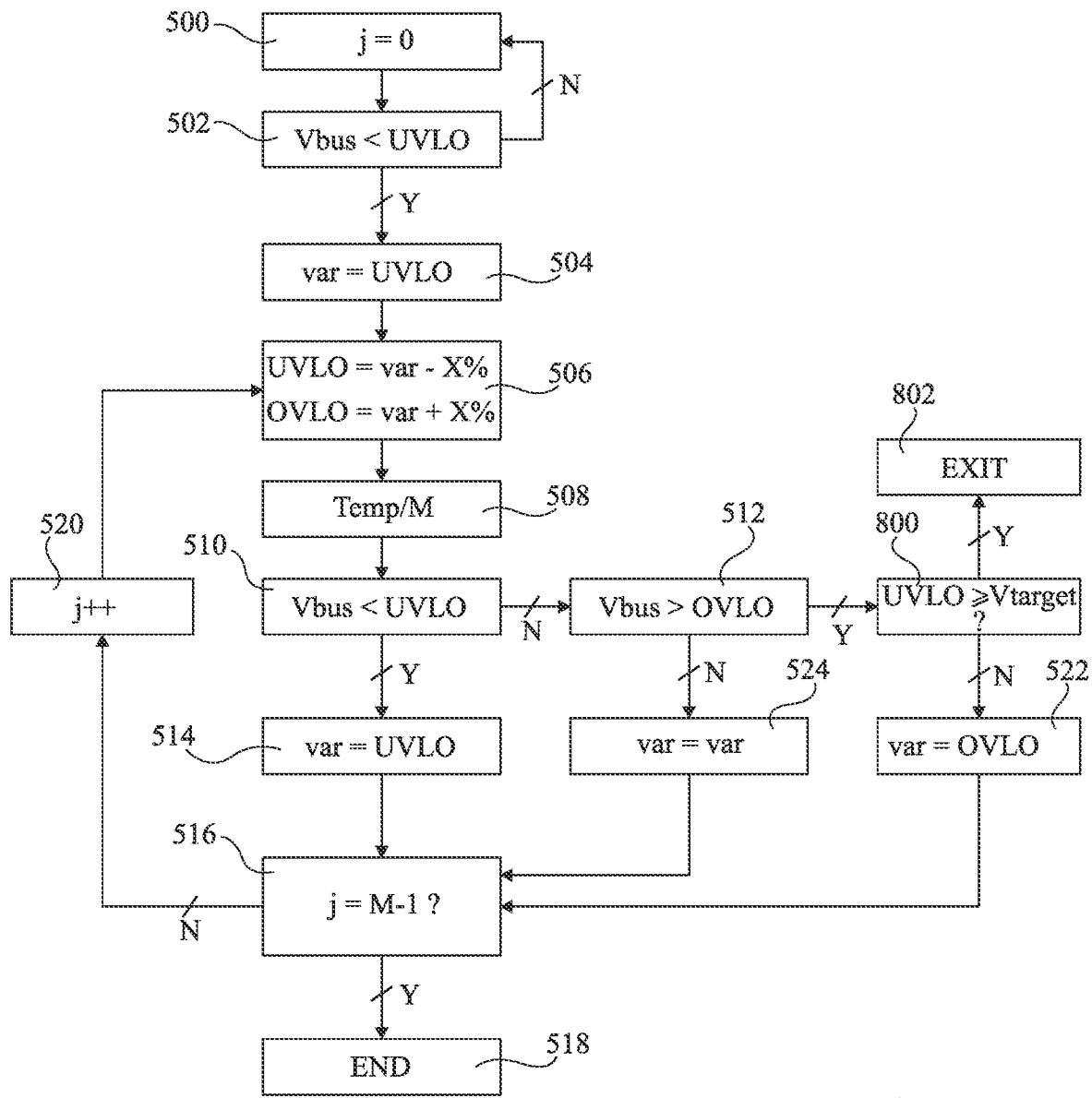
FIG. 6 shows in the form of blocks still another alternative embodiment of the method of FIG. 3, for example implemented in the interface of FIG. 2.

FIG. 6 shows, in the form of blocks, another alternative embodiment of the method of FIG. 3. Only the differences between the embodiment described in relation with FIG. 3 and the alternative embodiment described in relation with FIG. 6 are here highlighted.

In this variant, when voltage Vbus is greater than the OVLO threshold at step 512 (branch Y of block 512), the method carries on to a step 800 (block UVLO≥Vtarget). Step 800 comprises verifying whether the UVLO threshold used during the current iteration is greater or not than the value Vtarget defined by the negotiated power.

If it is (branch Y of block 800), the method ends at a step 802 (block EXIT). Indeed, if voltage Vbus is greater than the current value of the OVLO threshold, and thus than the current value of the UVLO threshold, and the current value of the UVLO threshold is further greater than the set point value Vtarget defined by the negotiated power, this means that voltage Vbus is greater than value Vtarget. This indicates that current I has become smaller than threshold It and that, accordingly, voltage Vbus has become greater than its set point value Vbus. Now, if voltage Vbus is greater than the UVLO threshold defined by the negotiated power, switch SW will not be turned off at the end of timing period Temp, and value Vtarget will not be modified either at the end of the timing period. It is thus no longer useful to search for the current value of voltage Vbus.

However, if at step 800, the current value of the UVLO threshold is greater than the defined value Vtarget, the method carries on to step 522.

An embodiment and variants of this embodiment have been described hereinabove in relation with FIGS. 3 to 6. It will be within the abilities of those skilled in the art to modify this embodiment and these variants, for example, by inverting the order of certain steps. Further, it will be within the abilities of those skilled in the art to combine two by two the variants of FIGS. 4 to 6, or to combine these three variant together.

The advantage of progressively varying value Vtarget between a first value Vtarget1 equal to a current value of value Vtarget' and a second value Vtarget2 equal to a default value of value Vtarget when the change in value Vtarget is caused by the falling of voltage Vbus under the UVLO threshold has been described hereinabove.

However, there are other situations during which value Vtarget should be modified to pass from a first value Vtarget1 to a second value Vtarget2. In these situations, it is also desirable for interface 214' (FIG. 2), for example, its circuit CTRL, to deliver successive values of value Vtarget which are in the range from value Vtarget1 to value Vtarget2, and which vary monotonously (either, strictly decreasing, or strictly increasing) from value Vtarget1 to Vtarget2.

Thus, according to an embodiment, interface 214', for example, its circuit CTRL, is configured to deliver these successive values of value Vtarget. This enables, as previously illustrated, to avoid unwanted and uncontrolled variations of signal cmd. It will be within the abilities of those skilled in the art to implement this additional function of interface 214'.

An example of such a situation occurs after a phase of renegotiation of the power that device 200 (FIG. 1) is supposed to deliver to load 400 (FIG. 1). In this case, value Vtarget passes from a first value Vtarget1 determined by the negotiated power, that is, the power that device 200 was supposed to deliver to load 400 until the renegotiation, to a second value Vtarget2 determined by the renegotiated power, that is, the power that device 200 was intended to deliver to the load after the renegotiation. According to an embodiment, interface 214', for example, its circuit CTRL, delivers successive values of value Vtarget which vary monotonously from value Vtarget1 to value Vtarget2. In this situation, circuit CTRL directly knows the value Vtarget1 determined by the negotiated power and the value Vtarget2 determined by the renegotiated power. It may then not be useful to determine a current value of value Vtarget'.

Various embodiments and variants have been described. Those skilled in the art will understand that certain features of these embodiments can be combined and other variants will readily occur to those skilled in the art.

In particular, an example where circuit CTRL delivers a signal VUVLO representative of the UVLO threshold and a signal VOVLO representative of the OVLO threshold has been described. In this example, signals V2 and V3 may be identical and for example delivered by a same voltage dividing bridge connected between terminals 307 and 308, or between terminals 314 and 308, or also between terminals 312 and 313. In another example, not illustrated, circuit CTRL is configured to deliver a single signal VVLO representative of the two UVLO and OVLO thresholds. In another example, signal VVLO is for example delivered to each of comparators Cp1 and Cp2 and is for example representative of the value Vtarget defined by the negotiated power. Further, signals V2 and V3 are for example each obtained with a different dividing bridge, connected between terminals 307 and 308, or between terminals 314 and 308, or further between 312 and 313.

Finally, the practical implementation of the described embodiments and variations is within the abilities of those skilled in the art based on the functional indications given hereinabove.

What is claimed is:

1. A power supply interface comprising:
   a first terminal configured to deliver a first direct current (DC) voltage;
   a first comparator configured to deliver a first signal representative of a comparison of the first DC voltage with a high threshold;
   a second comparator configured to deliver a second signal representative of a comparison of the first DC voltage with a low threshold; and
   a first circuit configured to:
      deliver successive pairs of values of the high and low thresholds for a first time period after the first DC voltage becomes smaller than a first value of the low threshold;
      modify values of the high and low thresholds between two successive pairs based on the first and second signals to determine a pair of values of the high and low thresholds surrounding the first DC voltage; and
      determine a current value of the first DC voltage based on the pair of values of the high and low thresholds surrounding the first DC voltage.

2. The interface according to claim 1, further comprising:
   a voltage converter comprising a second terminal configured to deliver a second DC voltage;
   a resistor and a switch in series between the second terminal and the first terminal; and
   a second circuit configured to deliver a control signal to the voltage converter so that the first DC voltage is equal to a first set point value.

3. The interface according to claim 2, wherein the first circuit is configured to determine a current value of the first set point value based on the current value of the first DC voltage.

4. The interface according to claim 2, wherein the second circuit is configured to determine the control signal so that, when the switch is conductive:
   the first set point value is equal to a second set point value when a current in the resistor is smaller than a current threshold; and
   the first set point value is smaller than the second set point value when the current is greater than the current threshold, a difference between the first and second set point values being determined based on a difference between the current and the current threshold.

5. The interface according to claim 4, wherein the first circuit is configured to determine a current value of the first set point value based on the current value of the first DC voltage, and wherein, when the first DC voltage is smaller than the first value of the low threshold at an end of the first time period, the first circuit is configured to control a turning off of the switch and then deliver successive values of the second set point value, the successive values being decreasing and ranging from the current value of the first set point value to a default value of the second set point value.

6. The interface according to claim 4, wherein the interface is configured to negotiate a supply power to be delivered to a load, when the load is connected to the interface, and wherein, when the supply power to be delivered is renegotiated, the first circuit is configured to deliver successive values of the second set point value monotonously varying between a value of the second set point value determined by the negotiated supply power and a value of the second set point value determined by the renegotiated supply power.

7. The interface according to claim 4, wherein the interface is configured to negotiate a supply power to be delivered to a load, when the load is connected to the interface, and wherein, when the switch is conductive and the supply power to be delivered has been negotiated, the second set point value is determined by the negotiated supply power.

8. The interface according to claim 4, wherein the first circuit comprises at least one digital-to-analog converter and one digital control unit configured to control the at least one digital-to-analog converter so that the at least one digital-to-analog converter delivers the values of the high and low thresholds, and wherein the digital control unit is further configured to control the at least one digital-to-analog converter so that the at least one digital-to-analog converter delivers the values of the second set point value.

9. The interface according to claim 1, configured to negotiate a supply power to be delivered to a load by implementing a universal serial bus-power delivery (USB-PD) technology, when the load is connected to the interface.

10. The interface according to claim 1, wherein the first circuit comprises at least one digital-to-analog converter and one digital control unit configured to control the at least one digital-to-analog converter so that the at least one digital-to-analog converter delivers the values of the high and low thresholds.

11. A method implemented in a power supply interface, the method comprising:
   delivering a first direct current (DC) voltage on a first terminal of the interface;
   delivering, by a first comparator of the interface, a first signal representative of a comparison of the first DC voltage with a high threshold;
   delivering, by a second comparator of the interface, a second signal representative of a comparison of the first DC voltage with a low threshold;
   detecting, by a first circuit of the interface, that the first DC voltage becomes smaller than a first value of the low threshold based on the second signal;
   delivering, by the first circuit, successive pairs of values of the high and low thresholds for a first time period after the detection;
   modifying, by the first circuit, the values of the high and low thresholds between two successive pairs based on the first and second signals to determine a pair of values of the high and low thresholds surrounding the first DC voltage; and
   determining, by the first circuit, a current value of the first DC voltage based on the pair of values of the high and low thresholds surrounding the first DC voltage.

12. The method according to claim 11, further comprising:
   delivering, by a voltage converter of the interface, a second DC voltage on a second terminal of the voltage converter coupled to the first terminal by a resistor and a switch in series; and
   delivering, by a second circuit of the interface, a control signal to the voltage converter such that the first DC voltage is equal to a first set point value.

13. The method according to claim 12, further comprising determining, by the first circuit, a current value of the first set point value based on the current value of the first DC voltage.

14. The method according to claim 12, wherein the switch is conductive, and the second circuit determines the control signal so that:
- the first set point value is equal to a second set point value in response to a current in the resistor being smaller than a current threshold; or
- the first set point value is smaller than the second set point value in response to the current being greater than the current threshold, a difference between the first and second set point values being determined by a difference between the current and the current threshold.

15. The method according to claim 14, further comprising:
- determining, by the first circuit, a current value of the first set point value based on the current value of the first DC voltage; and
- in response to the first DC voltage being smaller than the first value of the low threshold at an end of the first time period, controlling, by the first circuit, a turning off of the switch and delivering successive values of the second set point value, the successive values being decreasing and ranging from the current value of the first set point value to a default value of the second set point value.

16. The method according to claim 14, further comprising:
- negotiating a supply power to be delivered to a load in response to the load being connected to the interface; and
- in response to the supply power to be delivered being renegotiated, delivering, by the first circuit, successive values of the second set point value monotonously varying between a value of the second set point value determined by the negotiated supply power and a value of the second set point value determined by the renegotiated supply power.

17. The method according to claim 14, further comprising:
- negotiating a supply power to be delivered to a load in response to the load is connected to the interface; and
- in response to the switch being conductive and the supply power to be delivered having been negotiated, determining, by the negotiated supply power, the second set point value.

18. The method according to claim 14, further comprising:
- controlling, by a digital control unit of the first circuit, at least one digital-to-analog converter to deliver the values of the high and low thresholds; and
- controlling, by the digital control unit, the at least one digital-to-analog converter to deliver the values of the second set point value.

19. The method according to claim 11, further comprising negotiating a supply power to be delivered to a load, by implementing a universal serial bus-power delivery (USB-PD) technology, when the load is connected to the interface, in response to the load being connected to the interface.

20. The method according to claim 11, further comprising controlling, by a digital control unit of the first circuit, at least one digital-to-analog converter to deliver the values of the high and low thresholds.

* * * * *